(12) United States Patent
Farrar

(10) Patent No.: US 6,620,638 B1
(45) Date of Patent: Sep. 16, 2003

(54) TESTING OF MULTI-CHIP ELECTRONIC MODULES

(75) Inventor: Paul A. Farrar, Okatie, SC (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/163,402

(22) Filed: Jun. 5, 2002

(51) Int. Cl.⁷ .............................................. H01L 21/66
(52) U.S. Cl. .......................................... 438/14; 438/17
(58) Field of Search ............................ 438/14–16, 107, 438/17; 257/758, 759

(56) References Cited

U.S. PATENT DOCUMENTS

| | | |
|---|---|---|
| 3,548,915 A | 12/1970 | Reading et al. |
| 3,548,948 A | 12/1970 | Reading et al. |
| 3,687,737 A | 8/1972 | Krock et al. |
| 4,389,429 A | 6/1983 | Soclof |
| 4,525,921 A | 7/1985 | Carson et al. |
| 4,561,173 A | 12/1985 | Te Velde |
| 4,617,160 A | 10/1986 | Belanger et al. |
| 4,706,166 A | 11/1987 | Go |
| 4,962,058 A | 10/1990 | Cronin et al. |
| 5,202,754 A | 4/1993 | Bertin et al. |
| 5,270,261 A | 12/1993 | Bertin et al. |
| 5,324,683 A | 6/1994 | Fitch et al. |
| 5,324,684 A | 6/1994 | Kermani et al. |
| 5,336,914 A | 8/1994 | Andoh |
| 5,408,742 A | 4/1995 | Zaidel et al. |
| 5,444,105 A | 8/1995 | Ornstein |
| 5,457,334 A | 10/1995 | Nishimoto |
| 5,478,781 A | 12/1995 | Bertin et al. |
| 5,506,753 A | 4/1996 | Bertin et al. |
| 5,510,645 A | 4/1996 | Fitch et al. |
| 5,578,146 A | 11/1996 | Grant et al. |
| 5,581,498 A | 12/1996 | Ludwig et al. |
| 5,593,926 A | 1/1997 | Fujihira |
| 5,834,334 A | * 11/1998 | Leedy .......................... 438/107 |
| 5,891,797 A | 4/1999 | Farrar |
| 5,903,164 A | * 5/1999 | Kline .......................... 324/765 |
| 5,994,777 A | 11/1999 | Farrar |

OTHER PUBLICATIONS

"The New Low–k Candidate: It's A Gas"; Semiconductor International; Mar. 1999, p. 38.

E. Jan Vardaman; "Future Packaging Trends: CSP vs. Flip Chip"; Proceedings of the 11th European Microelectronics Conference; 1997; p. 295–99.

A.J. Blodgett and D.R. Barbour; "Thermal Conduction Module: A High–Performance Multilayer Ceramic Package"; IBM Journal of Research and Development, vol. 26 No. 1; Jan. 1982; p. 30–36.

* cited by examiner

Primary Examiner—John F. Niebling
Assistant Examiner—Olivia Luk
(74) Attorney, Agent, or Firm—Knobbe, Martens, Olson & Bear, LLP

(57) ABSTRACT

An in-process test sequence for integrated circuit chips that can be used to provide more accurate test results when the integrated circuit device properties are temporarily altered during the fabrication process. The test sequence comprises special Kerf tests for device property and metallurgy, slow speed tests to determine device and chip connectivity, and a final high performance test after the module is assembled. Device properties are tested via special Kerf sites before formation of a temporary material that may increase the capacitive load of the circuits and adversely impact the device properties. The in-process slow speed tests are designed to test the chips and devices at a speed substantially slower than their rated speeds so as to reduce the impact of the increase in capacitive load brought about by the temporary support material. After the module is assembled and temporary material removed, the module is exercised at its rated speed in a high final performance test. The yield of the final test should be relatively high as the various characteristics of the chips have already been screened in a piecemeal manner throughout the fabrication process.

41 Claims, 13 Drawing Sheets

TESTING OF MULTI-CHIP ELECTRONIC MODULES

BACKGROUND OF THE INVENTION

1. Field of the Invention

The present invention relates to semiconductor processing technology and, in particular, concerns methods of testing multi-chip electronic modules.

2. Description of the Related Art

Semiconductor manufacturers continually strive to increase the packaging density of integrated circuit chips, which has led to the development of high-density electronic packaging modules such as three-dimensional multi-chip structures. Multi-chip structures typically comprise a plurality of integrated circuit chips that are adhered together in a stack so as to reduce the amount of space that the chips occupy inside a system. Typically, each chip in the stack has a plurality of conductive input/output contacts that are exposed on at least one lateral surface of the chip. The exposed contacts provide conductive interconnection between the chips in the stack and external circuitry.

As a result of the increased device density of VLSI (Very-Large-Scale Integration) and ULSI (Ultra-Large-Scale Integration) integrated circuitry, wiring interconnective metallurgy between integrated circuit devices has become increasingly more complex. A higher packaging density likely requires an increase in the number of conductors, which likely reduces the space between adjacent conductors. Unfortunately, such dimensional reductions tend to increase the capacitance between adjacent conductors, thereby possibly increasing signal propagation delays and signal cross-talk. The limitations brought about by capacitive coupling between adjacent conductors has become a significant impediment to achieving higher wiring density.

The capacitive coupling effect is particularly apparent in high-density electronic packaging modules, such as three-dimensional multi-chip structures. In some multi-chip structures, the conductive leads on the integrated circuit chips are closely spaced, and adjacent leads may sometimes be separated by less than 1 micron. Consequently, reducing the distance between adjacent leads may adversely impact the functionality of the multi-chip structure due to an increase in the capacitive load between adjacent conductors. In addition, stacking the chips in close proximity to one another as required in multi-chip structures may also increase the capacitive coupling effect between conductors of adjacent chips.

Many integrated circuit chip designers have tried to address the problem of increased capacitive coupling between adjacent conductors by utilizing insulative materials that have lower dielectric constants than conventional dielectrics such as silicon-dioxide ($SiO_2$), which has a dielectric constant of about 4.5. In some cases, polymers, such as polyimides, which have a dielectric constant of about 2.8–3.5, have been used in place of $SiO_2$. However, the polyimides provide limited improvement for the capacitive coupling problem and, therefore, do not provide a significant advantage in use.

Alternatively, interconnects incorporating an air bridge structure have also been developed and are described in prior art references such as U.S. Pat. No. 5,891,797 to Farrar. Air bridge structures generally comprise suspended conductors that are surrounded by an air gap instead of the more conventional insulators. For example, U.S. Pat. No. 5,324,683 to Fitch et al. describes the formation of an air bridge structure in an integrated circuit by removing all or a portion of the dielectric layer between conductors so that the conductors are surrounded and insulated by an air gap. Air has a dielectric constant of approximately 1.0, which is substantially less than the dielectric constants of conventionally used insulators such as $SiO_2$ or various polyimides. As such, the air-gap insulator provides some improvement for the capacitive coupling effect associated with the increased wiring density of integrated circuit chips.

Although air bridge structures facilitate the development of integrated circuits with higher wiring density, the use of air bridge structures introduces new manufacturing challenges such as protecting the suspended air bridge conductors from being damaged during fabrication. To address this concern, a temporary support material as disclosed in Applicant's co-pending U.S. patent application Ser. No. 09/945,024, entitled MULTI-CHIP ELECTRONIC PACKAGE AND COOLING SYSTEM, which is hereby incorporated by reference in its entirety, can be used to stabilize and support the air bridges during fabrication. The temporary support material can be positioned beneath suspended air bridge conductors during manufacturing to provide rigidity to the conductors and subsequently removed when the chip stack assembly is complete. Disadvantageously, however, the temporary support material can impose certain constraints on in-process testing of the individual chip components and sub-assemblies.

In typical chip production, chips are tested at one or more points through a series of process steps with final functional testing of the individual chips being done prior to packaging. At many of these test points, chips such as memory chips are typically exercised at its rated speed and logic chips are tested for their speed and logic functions. Chips that pass the tests are usually packaged and subject to additional testing including margin tests for memory chips and more extensive functional tests for logic chips along with speed testing and sorting. With the higher speed sorts, generally, receiving a premium price in the market place. In some cases, if the chips are running at a relatively high yield, the final functional testing for chips may be delayed until after packaging, thus saving one testing cycle. For example, in the construction of large processors, memory chips with relatively high yield may be first assembled onto cards and these cards are then tested upon assembly. Additionally, a final system test is typically performed upon completion of assembling the entire system. Thus, the various testing steps allow defective chips to be detected and repaired or discarded at each step of the chip fabrication and assembly process.

However, the presence of the temporary support material in multi-chip structures may significantly increase the capacitive load on individual circuit elements thereby temporarily altering various functional properties of the integrated circuit devices. This temporary change in device characteristics caused by the support material makes it difficult to obtain accurate in-process device test results. Consequently, defective devices cannot be distinguished from the properly functioning ones during fabrication.

Hence, from the foregoing, it will be appreciated that there is a need for a method of performing accurate in-process testing of integrated circuit chips when the device properties are temporarily altered during the fabrication process. To this end, there is a particular need for a method of performing accurate in-process testing of a multi-chip electronic module comprising air bridge structures supported by a temporary material that affects the capacitive load of the circuit elements during fabrication.

SUMMARY OF THE INVENTION

In one aspect, the preferred embodiments of the present invention provide a method of manufacturing an integrated circuit chip, incorporating a novel in-process test sequence. The method comprises first forming a plurality of devices on a semiconductor substrate and then testing the device properties to determine if the devices are functional. Preferably, the testing is performed on special Kerf sites formed on the substrate. The method further comprises forming a plurality of conductors wherein at least some of the conductors are air bridge structures supported by a temporary member that may alter the device properties. In one embodiment, after formation of the conductors, the chip is subject to a chip metallurgy test performed on special Kerf test sites to determine whether the conductors are properly formed. The structures in the Kerf may include both active devices along with conductive structures which enable the testing of lines for resistivity from which the dimensions of the lines can be inferred. After the interconnects are formed, the process further comprises testing the devices at a speed substantially slower than the rated speed of the devices to determine whether proper electrically interconnections are established between devices. Preferably, the slow speed test is designed in a manner such that its results are substantially unaffected by the changes in device property brought about by the temporary member. After the device slow speed test, the process continues with completing formation of the chip, which can include assembling the chip into a chip stack to form a multi-chip module. After chip formation is complete, the temporary support material is removed and the chip is exercised at its rated speed to test the functionality of the chip.

In another aspect, the preferred embodiments of the present invention provide a method of forming a multi-chip electronic module. The method comprises forming a plurality of devices on a semiconductor substrate and testing the device properties to determine whether the devices are properly formed. The method continues with forming a support frame on an upper surface of the semiconductor substrate. Preferably, the support frame extends from the upper surface of the substrate and defines a protected spatial region for interconnection wiring. Preferably, the support frame also comprises a plurality of openings on a lateral surface of the support frame so as to permit a thermally conductive fluid to enter said spatial region and remove heat from the air bridge conductors and other interconnection wiring formed in the spatial region. In one embodiment, a temporary support material is also formed on the upper surface of the substrate in a manner such that the temporary support material stabilizes and provides structure support for the air bridge conductors so as to permit the chip to be processed and handled without causing damage to the air bridges and other interconnection. The temporary support material may comprise an insulative material that significantly increases the capacitive load of the devices and thus can alter device functional performances. To reduce the likelihood of generating erroneous test results based on altered device properties, the method further comprises exercising the devices at a speed substantially slower than the rated speeds of the devices to determine whether proper interconnections are made between the devices. Preferably, the devices are exercised at a speed that is sufficiently slow so that the test results are not impacted by the increase in capacitive load brought about by the temporary support material.

After slow speed testing the devices, the method further comprises assembling the semiconductor substrate in a chip stack in a manner such that an upper surface of the support frame is positioned adjacent to a lower surface of a second semiconductor substrate. At this stage, the chip stack is tested at a speed that is also substantially slower than its rated speed to determine whether the chips within the stack are properly interconnected to each other. The method follows with removal of the temporary support material after the chip stack assembly is complete. After removal of the temporary support material, the entire multi-chip module is exercised at its rated speed and run through a series of functional and connectivity tests to ensure that the system functions properly. In one embodiment, the method further comprises enclosing the chip stack inside an enclosure and introducing a thermally conductive fluid to the enclosure. The thermally conductive fluid has a thermal conductivity greater than that of air and the conductive fluid travels through the opening in the support frame and contacts the air bridge conductors formed in the spatial region and removes heat therefrom.

Advantageously, the preferred test sequence improves the yield of the final systems test because the test sequence provides a series of in-process tests that are designed to test various device properties and metallurgy of the integrated circuit before the circuit is incorporated into a system. Furthermore, the preferred test sequence provides tests that are modified to accommodate the incorporation of the temporary support material in the circuit structure during fabrication. The tests are modified in a manner such that the results are substantially unaffected by the increase in capacitive load brought about by the temporary support material. These and other advantages of the present invention will become more fully apparent from the following description taken in conjunction with the accompanying drawings.

DETAILED DESCRIPTION OF THE PREFERRED EMBODIMENT

Figure 1:
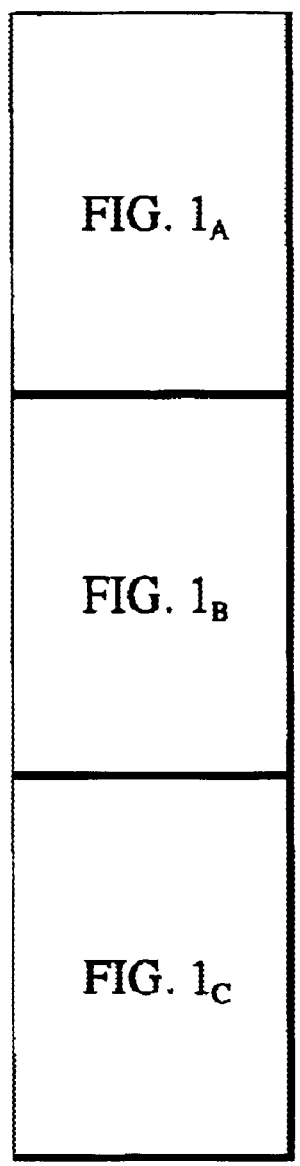
FIG. 1 is a schematic illustration of a process flow in fabricating a multi-chip electronic module, incorporating a preferred sequence of in-process device and circuitry testing steps.
Figure 1A:
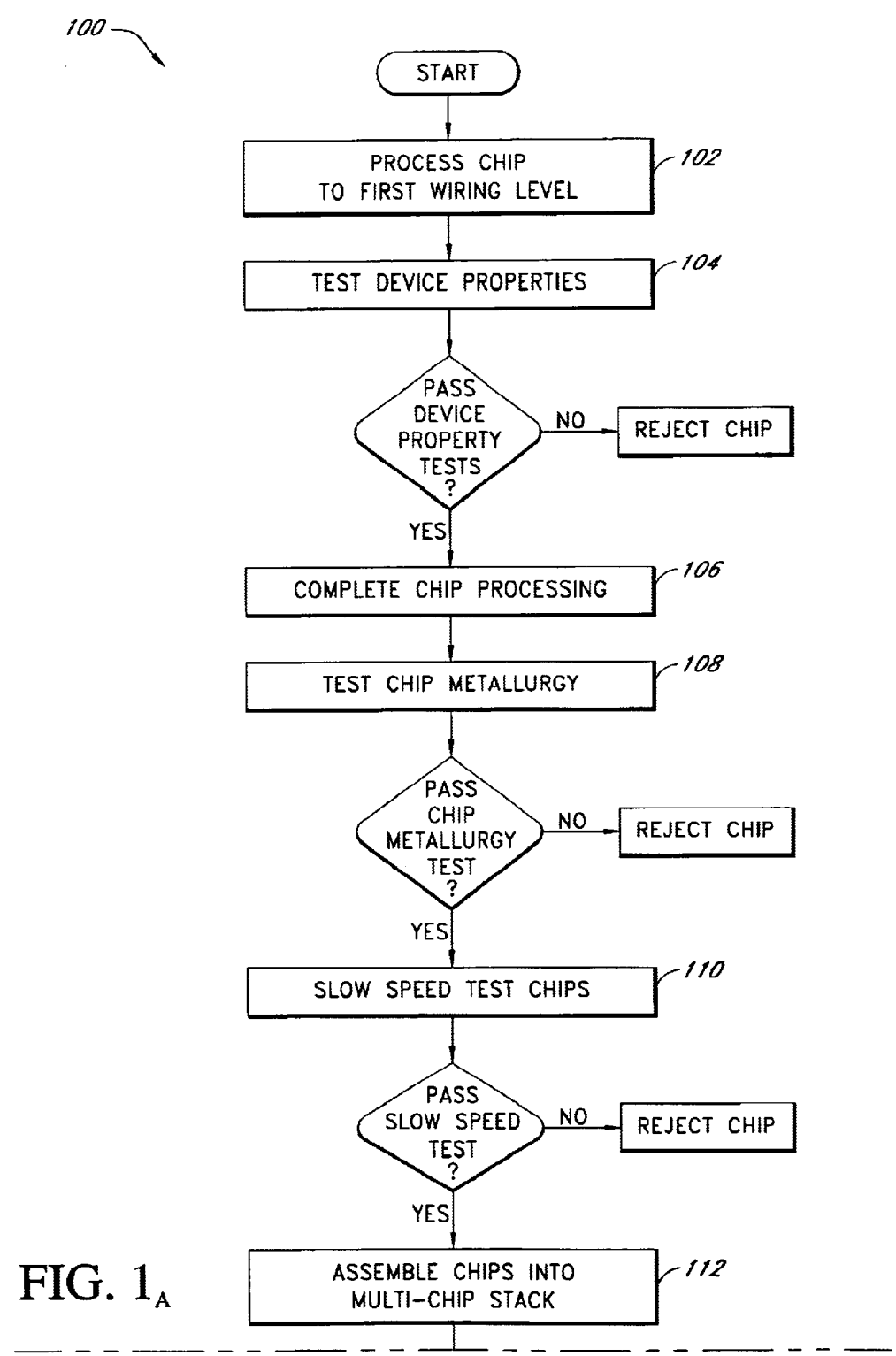
Figure 1B:
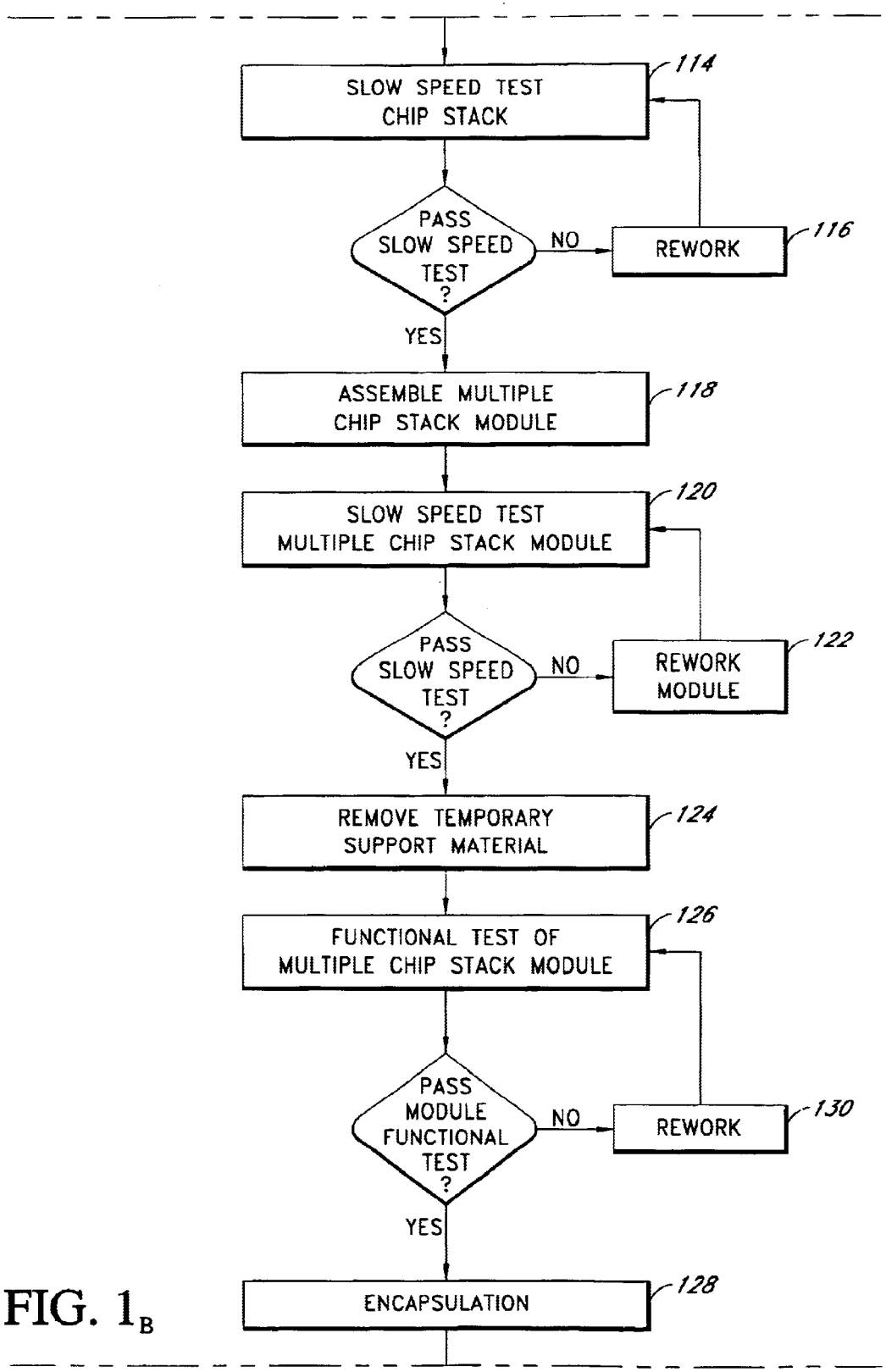
Figure 1C:
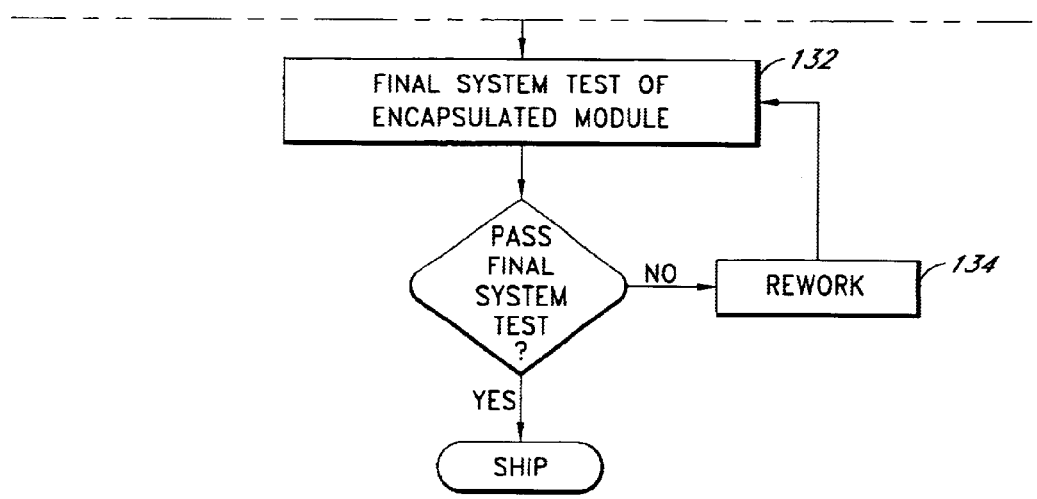

References will now be made to the drawings wherein like numerals refer to like parts throughout. FIG. 1 schematically illustrates a preferred process flow 100 in fabricating a multi-chip electronic module, incorporating a preferred sequence of in-process device and circuitry testing steps. As shown in FIG. 1, the process begins with step 102 comprising processing the chips on a wafer to a first wiring level using conventional semiconductor manufacturing processes. As it is understood in the art, the first wiring level generally refers to a first layer of conductors such as aluminum or copper that is formed to interconnect various integrated circuit devices already formed in the chip. The first wiring level is configured to electrically interconnect at least some of these devices, which include, but are not limited to, transistors, capacitors, resistors, memory cells, and logic gates.

As shown in FIG. 1, following formation of the first wiring level, the process 100 continues with Step 104 which comprises testing various device properties. In one embodiment, the device property tests can include, but are not limited to, determining transistor parameters and the resistivity of various first wiring level conductive lines using methods known in the art. The tests can also include testing metallurgical structures, capacitors, resistors, memory cells, and logic gates. Preferably, the device property tests are performed on Kerf test structures, which are generally known in the art as test circuits or devices formed on the wafer in an area between adjacent chips known as the Kerf or street. The Kerf test structures are preferably constructed with substantially the same functionality as the actual devices in the chips. Tests performed on the Kerf test structures are designed to simulate functional performance of the actual devices in the chips. It is advantageous to test the device properties at this stage because process material that may temporarily alter or adversely affect the device properties have not yet been applied to the chip at this point. For example, the first wiring level may or may not include more complex wiring structures such as air bridge conductors that may have to be supported by a temporary material, which as will be described in greater detail below, can significantly increase the capacitive load of the circuitry, which in turn can affect the accuracy of the device property test results. Regardless whether air bridges are used in the wiring of a level, the conductors of the test structures in the Kerf are preferably built to substantially the same width and thickness as the actual system conductors without resorting to the use of air bridge constructions. As such, the line resistivity can be easily measured via the Kerf structures and from the test results, it can be inferred as to whether the system conductors are formed with the proper width and thickness since the same deposition and photo processes are used to form both the Kerf and system conductors.

FIG. 1 further shows that chips that fail the device property tests in Step 104 are rejected while chips that pass the tests proceed to Step 106 to complete chip processing. Step 106 comprises forming additional wiring levels on the chip for additional electrical interconnections between devices. In one embodiment, some of these wiring levels include known air bridge structures that are comprised of suspended conductors surrounded by an air gap instead of the more conventional insulators. Preferably, a temporary support material is used to stabilize and provide structural support for the air bridge structures and is preferably removed after the chips are assembled into a multi-chip module. In one embodiment, the temporary support material is an insulative material that significantly increases the capacitive load of chip circuitry. This increase in capacitive load can impact the device performance and consequently skew the test results of various device properties. Thus, substantially all device property tests are performed on Kerf devices, which are formed without the use of temporary support material in the wiring, so as to obviate the need of testing device properties once the temporary material is formed. The structure and method of formation of the air bridge structures and temporary support material are described in greater detail below.

After additional wiring levels are formed and chip processing is completed, the process 100 follows with Step 108 in which chip metallurgy is tested using methods known in the art. The chip metallurgy test is designed to determine whether proper electrical interconnects are formed. In one embodiment, the tests are performed on Kerf test structures that are designed to simulate the dimensions and configurations of the actual conductors. The chip metallurgy test may include measuring the line resistance in Kerf devices to determine whether desired conductor cross sections are achieved and also to detect the presence of opens and shorts. As shown in FIG. 1, chips that fail the chip metallurgy test are rejected while chips that pass the test proceed to Step 110.

Step 110 comprises exercising the chip at a speed slower than the chip's rated speed to determine if the devices on each chip are properly interconnected with each other. For example, in one embodiment, chips that are designed to run at about 5 gigahertz are now exercised at about 50 kilohertz. In another embodiment, the chips are exercised at about 1% of its rated speed. In one preferred embodiment, the slow speed test is performed on the actual devices rather than on Kerf test structures. In one embodiment, the slow speed test can be performed via probing contact pads formed on the chips. At this stage, the chip is preferably exercised at a speed slower than its rate speed because the increase in capacitive load of the circuits brought about by the temporary support material may affect the test results if the chip is run at its normal speed. Furthermore, since the device properties have already been tested in Step 104, there is no need to exercise the chips at its rated speed to test for device functionality at this stage. The slow speed test is designed to provide an indication of whether devices on the chips are properly interconnected to each other. Chips that fail the test are discarded while chips that pass proceed to Step 112.

As shown in FIG. 1, in Step 112, the chips are diced using generally known methods and assembled into a multi-chip stack in a manner as described in Applicant's co-pending patent application Ser. No. 09/382,524, entitled "INSULATOR FOR HIGH DENSITY CIRCUITS", which is hereby incorporated by reference in its entirety. The multi-chip stack can include both memory and non-memory chips. In one embodiment, the chips can be stacked and secured together in a manner so as to form a base structure having a first lateral face that is comprised of a portion of each chip. In another embodiment, exterior chips can be mounted on the lateral faces of the base structure in a manner as described in patent application Ser. No. 09/382,524. The exterior chips can comprise logic and processor chips such as A to D converter chips while the chips in the base structure can comprise memory chips. The exterior chips can be mounted and interconnected to the chip stack using C4 connections, modified C4 connections and other methods disclosed in Applicant's co-pending U.S. patent applications Ser. No. 09/945,024, entitled "A THREE DIMENSIONAL MULTI-CHIP STRUCTURE AND METHOD OF MAKING THE SAME", and Ser. No. 09/944,957, entitled "ANGLED INTERCONNECT", which are hereby incorporated by reference in their entirety.

After the multi-chip stack is assembled, the chip stack is subject to a slow speed test in Step 114. The slow speed test is designed to determine whether chips in the chip stack are properly interconnected to each other. The test can be performed using a variety of test methods, such as probing the input and output terminals of the chip stack. In some embodiments, special test structures can be formed on the chip stack for the slow speed test. At this stage of fabrication, the chip stack is preferably exercised at a speed slower than its rated speed because the increase in capacitive load of the circuits brought about by the temporary support material in the chips may skew the test results if the chip stack is run at its rated speed. Moreover, since the device properties were tested and screened from the outset in Step 104, it may not be necessary to exercise the chip stack at its rated speed to test for chip stack functionality at this stage.

Multi-chip stacks that fail the slow speed test of Step 114 can be discarded, off spec for speed, or reworked in Step 116 while chip stacks that pass the slow speed test proceed to Step 118 in which more than one chip stacks are assembled together. In one embodiment, a plurality of chip stacks can be combined into a single electronic module using methods described in Applicant's co-pending U.S. patent application Ser. No. 09/945,042, entitled "MULTIPLE CHIP STACK STRUCTURE AND COOLING SYSTEM", which is hereby incorporated by reference in its entirety. After the chip stacks are combined into a multiple chip stack module, the module is again slow speed tested in Step 120 to ensure that proper electrical interconnections are established between chips and chip stacks in the module. The slow speed test can be performed using a variety of methods such as probing the input and output terminals of the module. Furthermore, in some embodiments, special test structures can be formed on the multiple chip stack module for the slow speed test.

Multiple chip stack modules that fail the slow speed test in Step 120 can be discarded or reworked in Step 122 while modules that pass proceed to Step 124 in which the temporary support material is removed using methods described in greater detail below. After the temporary support material is removed, the multiple chip stack module is subject to a functional test in Step 126. During this test, the electronic module is tested at its rated speed for functionality and interconnection. Since the temporary support material is removed at this stage, the chips can be exercised at their rated speeds without the concern of generating inaccurate test results due to increased capacitive loading brought about by the temporary support material. In one embodiment, the chips are run through a series of patterns to duplicate actual usage using methods known in the art. Multiple chip stack modules that pass the functionality and connectivity tests are encapsulated in a container in Step 128 using methods that are described in Applicant's co-pending U.S. patent application Ser. No. 09/945,024, entitled MULTI-CHIP ELECTRONIC PACKAGE AND COOLING SYSTEM, and will also be described in greater detail below. Modules that fail the test can be discarded or reworked in Step 130.

After the multiple chip stack module is encapsulated, the module is subject to a final systems test in Step 132 to ensure that the encapsulated module performs properly. In one embodiment, the final systems test comprises running the module through a series of routines that the module is designed to performed. In other embodiments, the final systems test comprises margin, speed and high/low temperature testing. Multiple chip stack modules that fail the final system test can be discarded or reworked in Step 134 while modules that pass the test are complete and ready for shipment.

Advantageously, the above-described process 100 provides an in-process test sequence designed to accommodate the presence of temporary materials in the chip structure that may temporarily affect the accuracy of device property test results. In particular, the process 100 is set up to perform the necessary device property tests before the formation of the temporary material so as to avoid inaccurate test results which may arise due to an increase in capacitive load caused by the material. The preferred test process modifies and segments existing test methods in a manner such that only tests unaffected by the increase in capacitive load are performed while the temporary material is in place. Moreover, the preferred test process is set up to detect defective chip devices and metallurgy long before the chips are subject to final systems test, thus ensuring a relatively high yield from the final performance test. Although the in-process test sequence is incorporated into the process flow for fabricating a multiple chip stack module, it can be appreciated that the test sequence can be applied to any integrated circuitry containing a temporary component that affects the device properties.

Figure 2:
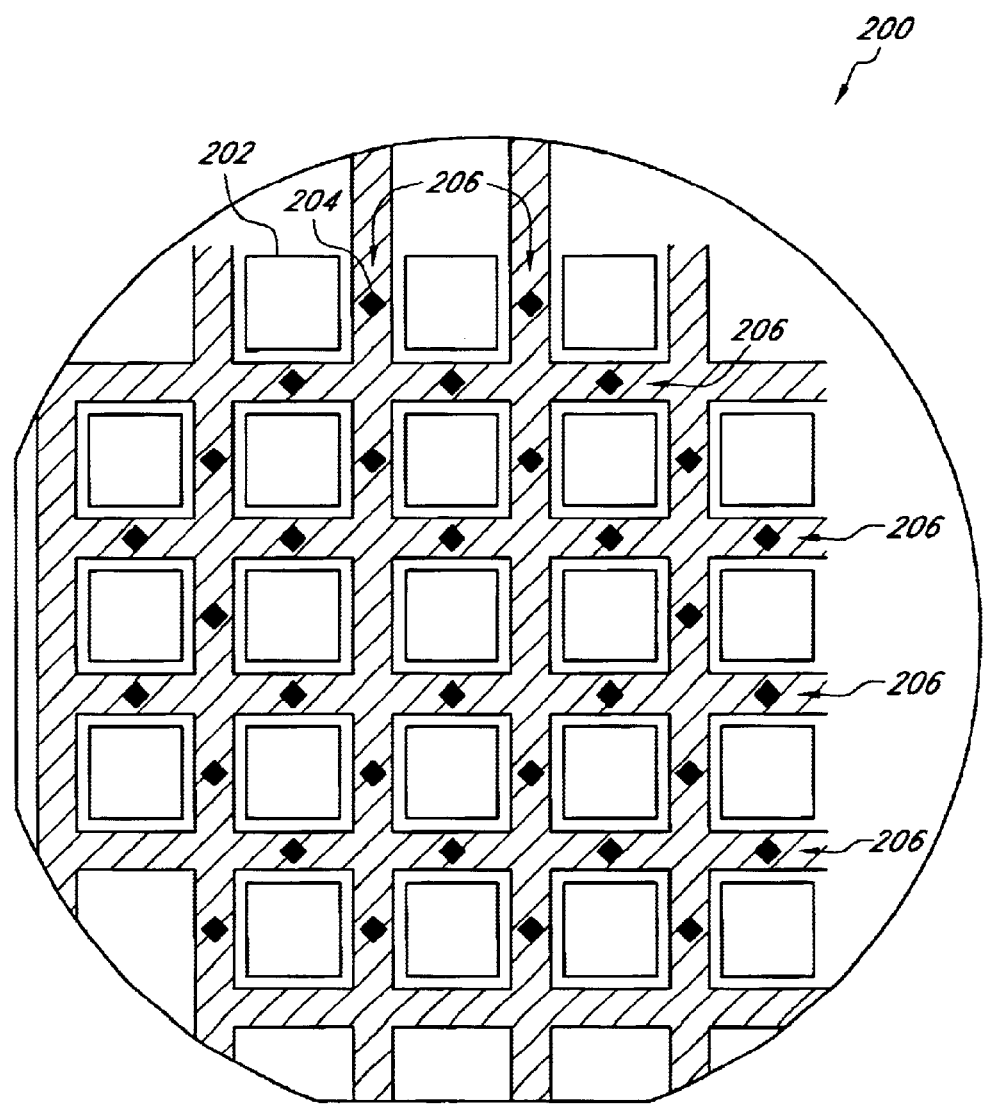
FIG. 2 is a partial schematic illustration of one embodiment of a semiconductor wafer comprising chips that can be diced to form individual chips and assembled into a multi-chip electronic module of the preferred embodiments.

FIG. 2 is a partial schematic illustration of one embodiment of a semiconductor wafer 200 comprising a large number of densely packed integrated circuit chips 202 that can be diced and separated from each other to form individual chips and incorporated into a multi-chip module. The process of fabricating the chips and assembling the chips into a multi-chip module preferably includes the sequence of in-process testing steps described above. As shown in FIG. 2, the wafer 200 comprises a plurality of test sites 204 formed on the Kerf or Street area 206 of the wafer 200, which is typically the space between adjacent chips. These test sites 204 include, but are not limited to, test devices and conductive test lines configured to simulate the workings of the actual devices and circuitry on the chip. In one embodiment, the test lines connect the ground and power supply ports on each chip to common contact pads located around the periphery of the wafer. The device properties of each chip 202 can be tested via these test sites 204 using a number of testing methods and equipment known in the art.

Figure 3:
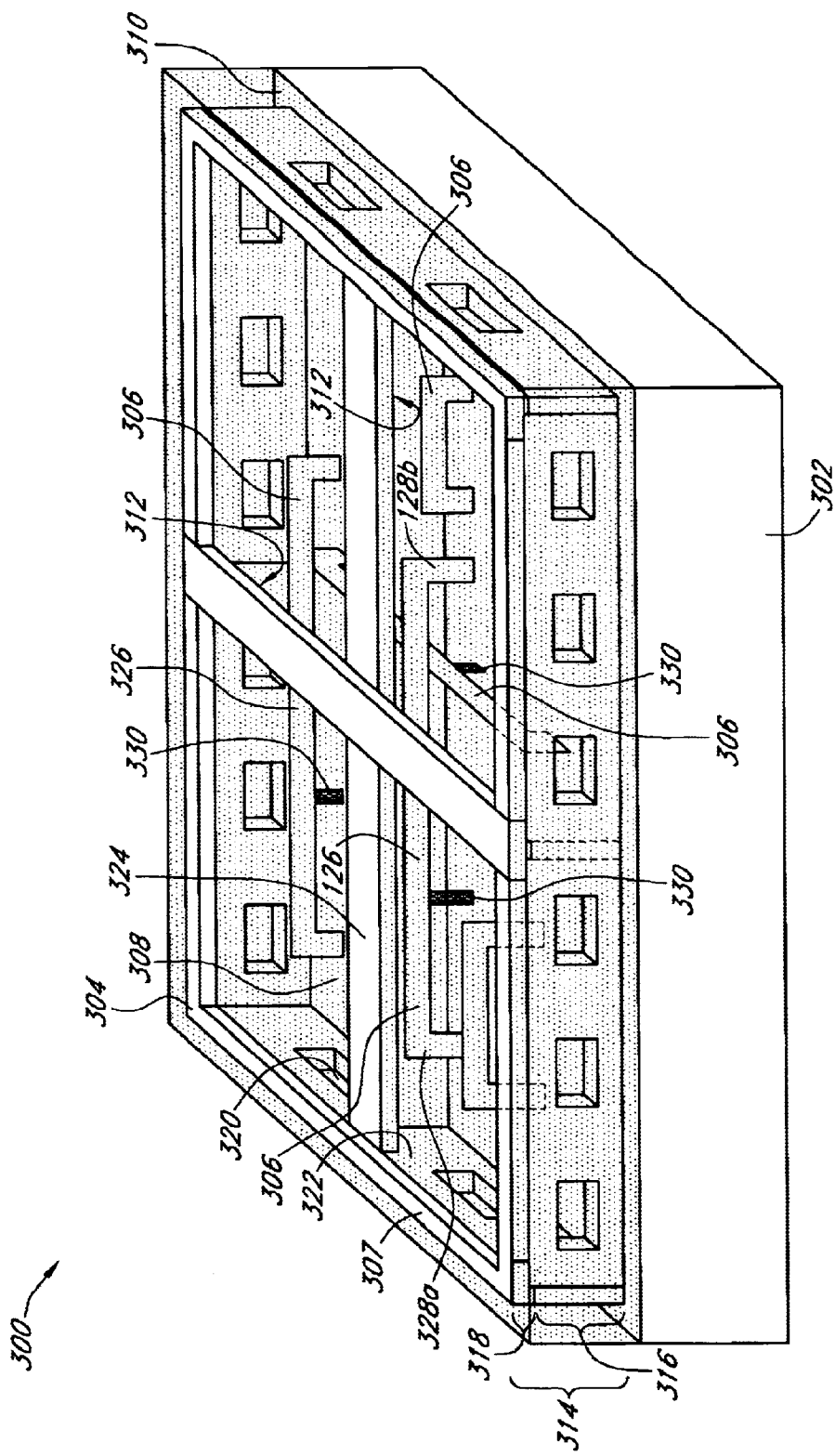
FIG. 3 is a partial schematic perspective view of one embodiment of an integrated circuit chip formed on the wafer shown in FIG. 2.

FIG. 3 is a partial schematic illustration of one embodiment of an integrated circuit chip 300 formed on the wafer 200 shown in FIG. 2. As FIG. 3 illustrates, the chip 300 comprises a substrate 302, such as a silicon substrate, that carries a variety of integrated circuitry and devices, such as capacitors, resistors, transistors, memory cells, and logic gates, that are formed using conventional semiconductor manufacturing processes. The chip 300 further comprises a support frame 304, a plurality of air bridge structures 306, and a temporary support material 307 that are each formed on an upper surface 308 filling the remaining space of the substrate 302 using methods known in the art or, more preferably, in accordance with methods described in Applicant's co-pending U.S. Patent Application Ser. No. 09/382,929 entitled "PACKAGING OF ELECTRONIC CHIPS WITH AIR-BRIDGE STRUCTURES", which is incorporated by reference herein in its entirety.

As FIG. 3 illustrates, the support frame 304 is substantially rigid and extends from the upper surface 308 of the substrate 302 in a manner so as to protect the air bridge structures 306 and other interconnection wiring from being damaged by the weight of adjacent chips when the chip 300 is placed in a multi-chip stack and by handling during assembly of the stack. In one embodiment, the support frame 304 preferably extends along an outer perimeter 310 of the substrate 302 in a manner so as enclose the interconnection wiring formed on the upper surface 308 of the substrate 302. In another embodiment, the support frame 304 further includes a plurality of reinforcement ribs 312 that extend across the length and width of the substrate 302 to provide additional mechanical support and protection for the chip 300 and its interconnection wiring when the chip 300 is placed in a stack with other chips.

As FIG. 3 further illustrates, the support frame 304 defines a protected spatial region 314 extending above the upper surface 308 of the substrate 302. The spatial region 314 preferably comprises wiring levels 316 that are suitable for formation of air bridges 306 and other interconnection wiring. A wiring level is herein defined as a planar section above and substantially parallel to the upper surface of the substrate which can contain air bridges and other conductors that extend in the same general plane. It can be appreciated that the chip 300 may comprise any number of wiring levels and is not limited to the number of wiring levels shown in FIG. 3.

Furthermore, the support frame 304 preferably has an upper portion 318 extending above the uppermost wiring level. The upper portion 318 preferably serves as a spacer separating the chip 300 from subsequently mounted adjacent chips. As will be described in greater detail below, the thickness of the upper portion 318 can be dimensioned in accordance with the particular spacing desired between adjacent chips. In one embodiment, the upper portion 318 is dimensioned so that the chip 300 when stacked in a multi-chip structure will be in proper alignment with conductive contacts, such as C4 contacts, positioned on chips that are subsequently mounted to the lateral faces of the multi-chip structure. Advantageously, the upper portion 318 of the support frame 304 may replace the conventional insulator spacer material that is typically interposed between adjacent chips in a chip stack. Because the upper portion 318 of the support frame 304 is substantially rigid and has a uniform thickness, it allows for more precise control and tuning of the distance separating adjacent chips in a chip stack.

Additionally, as shown in FIG. 3, the support frame 304 further comprises a plurality of openings 320 that are formed on a lateral surface 322 of the frame 304 using methods known in the art. As will be described in greater detail below, the openings 320 allow a thermally conductive medium, such as air, gas, or even liquid, to enter the spatial region 314 containing the air bridge structures 306 and circulate therethrough, thus removing heat generated from the conductors in the spatial region 314. Advantageously, the openings 320 permit a thermally conductive medium to circulate freely in and out of the spatial region 314 enclosed by the support frame 304 even when the chip 300 is placed in a stack with other chips. The openings 320 can be positioned at various locations on the support frame 304 and can take on a variety of different sizes and shapes without departing from the spirit of the invention.

In one embodiment, the support frame 304 is fabricated by depositing a layer of metal on the upper surface 308 of the substrate 302 using chemical vapor deposition (CVD), plasma enhanced CVD (PECVD), physical vapor deposition (PVD) techniques, Electro-plating, electroless plating, sputtering, and/or electroforming. The metal layer is subsequently patterned and etched to define the configuration of the frame 304. In another embodiment, the support frame 304 and interconnection wiring for each wiring level are formed in the same process set using methods disclosed in Applicant's co-pending U.S. Patent Application Ser. No. 09/640,149, entitled "MICROELECTRONIC DEVICE PACKAGING WITH CONDUCTOR ELEMENT", which is incorporated by reference herein in its entirety. The support frame 304 can be made of a conductive material such as copper. Alternatively, the support frame 304 may comprise copper and an organic and/or inorganic insulating insert material. The insulating insert material is preferably incorporated in the reinforcement ribs 312 adjacent to where air bridge conductors are likely to extend through the ribs. In other embodiments, the support frame 304 may comprise an insulator made of organic and/or inorganic materials.

As FIG. 3 further shows, the temporary support material 307 formed on the upper surface 308 of the substrate 302 fills substantially the entire spatial region 314 comprising the interconnection wiring so as to stabilize and provide temporary structural support for the air bridges 306 and other circuitry therein. The temporary support material 307 permits the chip 300 to be processed and handled without causing damage to the air bridge conductors 306 or support frame 304 during subsequent process steps. The temporary support material 307 may be formed on the upper surface 308 of the substrate 302 using generally known chemical deposition processes. Preferably, the temporary support material 307 is polished back to a thickness that just exposes an upper surface 324 of the support frame 304 as shown in FIG. 3, which provides the chip with a leveled surface 324 for mounting as well as electrical bonding. The upper surface 324 of the support frame 304 and additional metal ledges (not shown) formed on the outside of the support frame 304 can be used to facilitate electrical detection of the end points during the process of removing the support material 307.

As described above, the temporary support material 307 stabilizes the air bridge structures 306 and the support frame 304 formed on the substrate 302, thus allowing the chip 300 to be handled and processed without being damaged. As such, the support material 307 preferably is not removed until the chip 300 has been assembled into a multi-chip stack. In one embodiment, the temporary support material 307 may comprise carbon or other materials that can be oxidized or otherwise chemically removed with relative ease. In another embodiment, the temporary support material 307 may comprise a polymer such as high temperature polyimide, a photoresist, parylene such as parylene C or any combinations thereof. However, the presence of the temporary support material 307 may significantly increase the capacitive load between adjacent integrated circuits. This increase in capacitive load can skew device functional test results. Thus, it is advantageous to test circuit characteristics that are not impacted by the increase in capacitive load while the temporary support material is in place.

Furthermore, as shown in FIG. 3, the air bridge structures 306 are formed above the upper surface 308 of the substrate 302 to electrically interconnect a first and a second exposed contact 328a, 328b extending from the upper surface of the substrate 302. Each air bridge structure 306 generally comprises a conductor 326 that is suspended by the two or more conductive contacts 328a, 328b. As described above, the conductors 326 are stabilized and supported by the temporary support material 307, but will become suspended in air once the temporary support material 307 is removed. The air bridges 306 can be formed using methods known in the art such as damascene or dual damascene processes. Furthermore, Applicant also discloses a method of forming air bridge interconnects in U.S. Pat. No. 5,891,797 to Farrar entitled "METHOD OF FORMING A SUPPORT STRUCTURE FOR AIR BRIDGE WIRING OF AN INTEGRATED CIRCUIT," which is hereby incorporated by reference in its entirety. In one embodiment, the air bridge structures 326 may be fabricated using conductive materials, such as aluminum, copper, gold, silver, platinum, polysilicon, and amorphous silicon. In addition, methods for depositing conductive air bridge interconnects may include deposition processes, such as chemical vapor deposition (CVD), and physical vapor deposition (PVD), sputtering and electron beam evaporation or various liquid deposition techniques.

As FIG. 3 also shows, the air bridge conductors 326 may be further supported by a plurality of intermediate posts 330 that are formed on the upper surface 308 of the substrate 302. Once the temporary support material 307 is removed from underneath the conductors 326, the posts 330 are preferably used to support the longer air bridge conductors as the longer conductors may sag in the center and touch a neighboring air bridge interconnect, which may cause an electrical short therebetween. To reduce the occurrence of sagging, some longer air bridge interconnects may require more than one intermediate posts along the length of the bridge. The posts 330 may be formed using methods generally known in the art or those described in U.S. Pat. No. 5,891,797 to Farrar, or, more preferably, methods described in Applicant's Application Ser. No. 09/382,929 entitled "PACKAGING OF ELECTRONIC CHIPS WITH AIR-BRIDGE STRUCTURES". In one embodiment, the posts 330 are comprised of an insulating material such as $SiO_2$ or a polymer such as polyimide. In another embodiment, the posts 330 are comprised of the same material as the air bridge conductors 326, however insulator inserts are interposed between the posts and the substrate.

Figure 4:
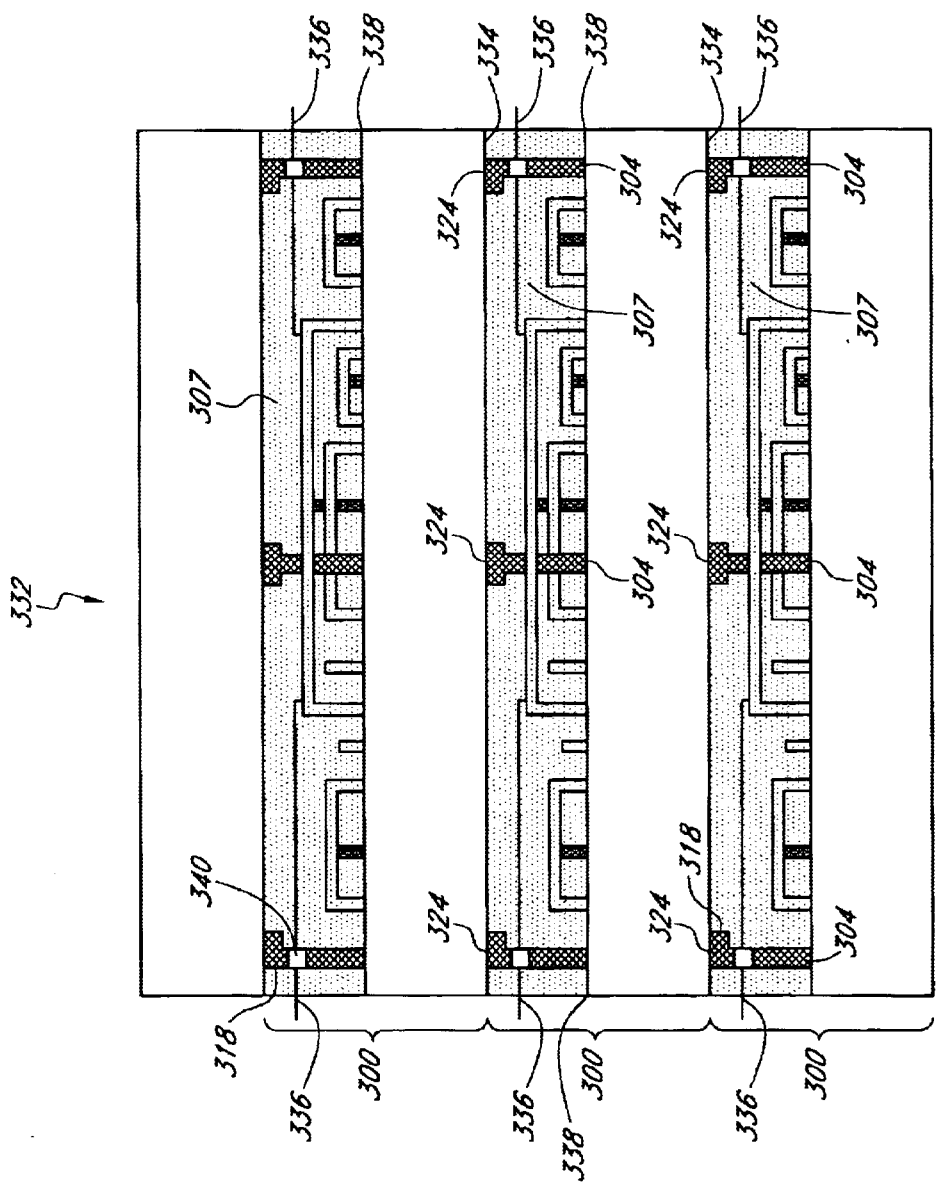
FIG. 4 is a partial schematic cross-sectional view of a chip stack incorporating the chip shown in FIG. 3.

FIG. 4 provides a partial schematic cross-sectional view of a chip stack 332 incorporating the chip 300 described and shown in FIG. 3. The chip stack 332 comprises a plurality of chips 300 that are stacked together in a manner such that the upper surface 324 of the support frame 304 of one chip is positioned adjacent to a lower surface 334 of the substrate 302 of another chip. The chips 300 may be bonded to each other using C4 contacts and/or adhesives as described in the Applicant's co-pending U.S. patent application Ser. No. 09/932,859, entitled "A THREE DIMENSIONAL MULTI-CHIP STRUCTURE AND METHOD OF MAKING THE SAME", which is incorporated by reference herein its entirety.

Furthermore, as described above, the thickness of the upper portion 318 of the support frame 304 can be fine tuned in accordance with the distance desired between chips 300. In one embodiment, the temporary support material 307 is removed once the chip stack 332 is assembled. However, in embodiments that involve mounting additional exterior chips to the lateral faces of the chip stack, the temporary support material 307 is preferably removed after the exterior chips are mounted. The temporary support material 307 is preferably chemically removed in a manner that does not damage the devices and circuitry formed on the chips. In one embodiment, the temporary material 307 is oxidized in an environment containing molecular oxygen or ozone or an oxygen plasma. In an oxidation process utilizing molecular oxygen, the process time, temperature and pressure can be increased to effectively remove substantially all carbon-based materials. In a plasma oxidation process, the lower pressures utilized are likely to facilitate complete removal of all organics. As such, it is desirable to use readily oxidized polymeric materials or carbon as the temporary support and/or spacer materials. After the temporary support material is removed, the chip stack can be functionally tested at its rated speed.

As FIG. 4 further shows, a plurality of conductive leads 336 extend from interconnects on the uppermost wiring level, through the support frame 304, and toward an outer edge 338 of the chip 300. Preferably, the leads 336 extend past the chip edge 338 and serve as electrical contact points with external circuitry. In cases where the support frame 304 is made of a conductive material, the leads 336 are preferably routed through an insulator insert 340 formed on the support frame 304 as shown in FIG. 4.

Figure 5:
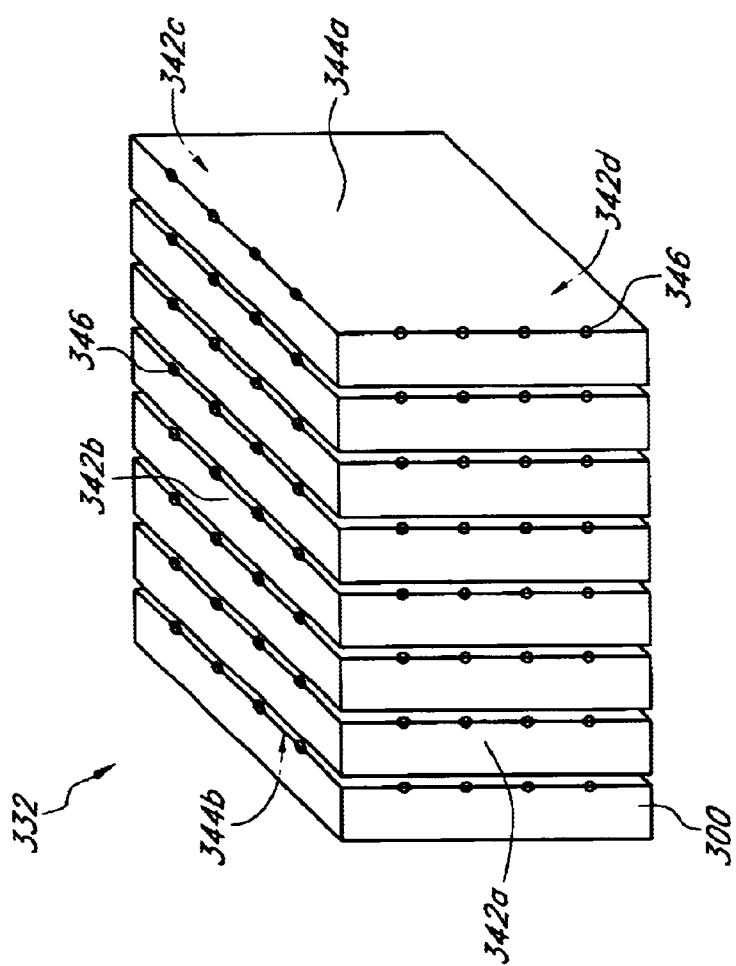
FIG. 5 is a schematic perspective view of the chip stack of FIG. 4.

FIG. 5 provides a schematic perspective view of the chip stack 332. As shown in FIG. 5, the chip stack 332 comprises a plurality of lateral faces 342a, b, c, d and an upper and a lower face 344a, b. Preferably, each lateral face of the stack 332 is comprised of a side surface of each chip 300 and the upper and lower faces of the stack 332 comprise the respective outer substrate surfaces of the chips located on the ends of the stack. FIG. 5 also shows a plurality of electrical contacts 346 are formed the lateral faces 342a, b, c, d of the chips stack 332. These electrical contacts 346 are preferably interconnected to the conductive leads that extend from the upper wiring level of each chip 300. In one embodiment, the chips 300 in the stack 332 are memory chips. In another embodiment, only a portion of the chips in the chip stack 332 incorporate the air bridge structures and the support frames as described above while the remaining chips utilize conventional circuitry and spacer material between chips so as to improve the overall structural integrity and ruggedness of the chip stack 332.

Figure 6:
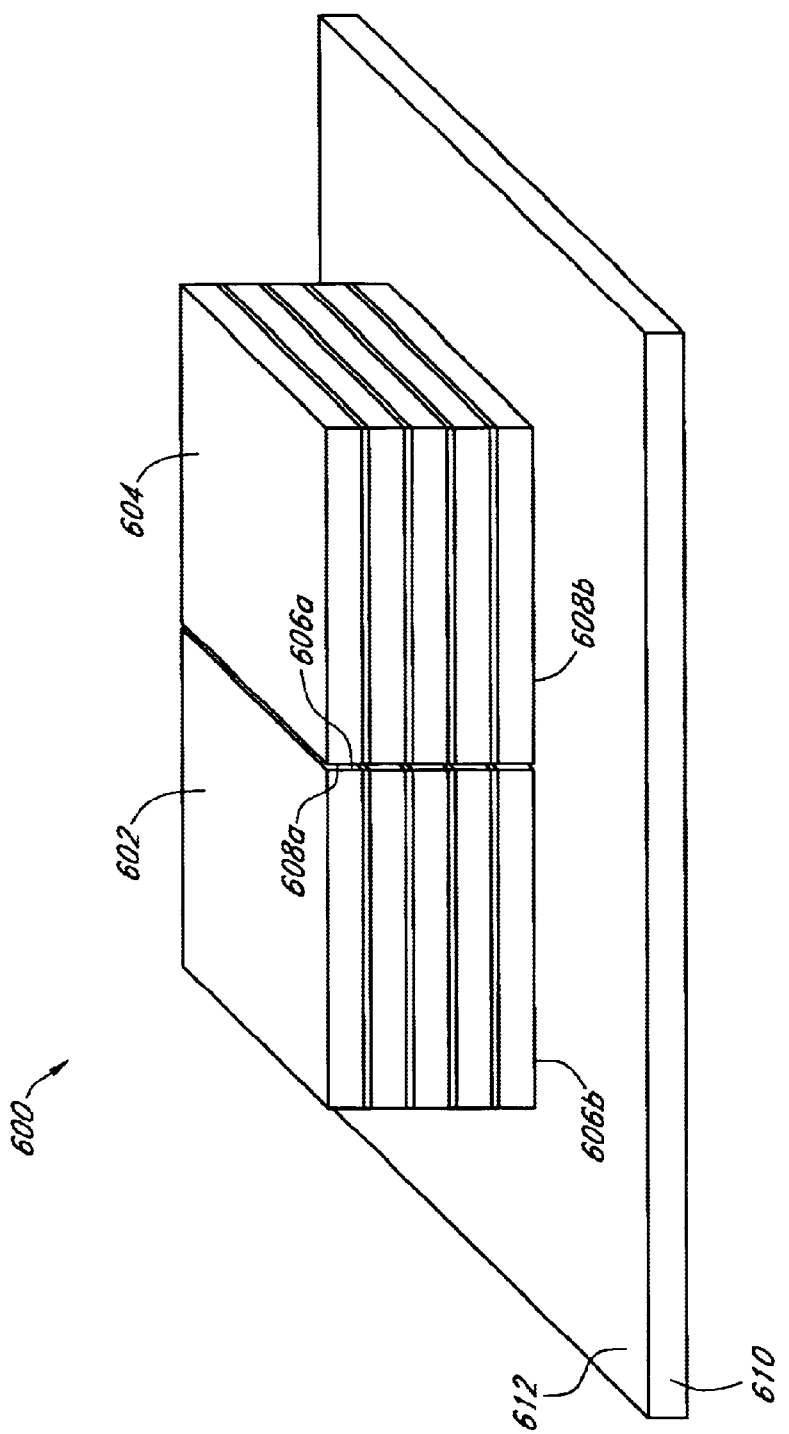
FIG. 6 is a schematic illustration of one embodiment of a high-density electronic packaging module incorporating the chip stack of FIG. 5.

FIG. 6 illustrates one embodiment one an electronic module 600 of the present invention, which is comprised of a plurality of chip stacks joined together to form a single, compact structure. As shown in FIG. 6, the module 600 comprises two chip stacks 602, 604 that are bonded together in a side-by-side configuration. The chip stacks 602, 604 may be formed in substantially the same manner as the chip stack 332 shown in FIG. 5. Preferably, each chip stack has a plurality of lateral faces that are comprised of a side surface of each chip. As shown in FIG. 6, a first lateral face 606a of the first chip stack 602 is positioned immediately adjacent to a first lateral face 608a of the second chip stack 604. In one embodiment, the first lateral faces 606a, 608a are bonded together by an adhesive and/or C4 connections. Furthermore, electrical contacts (not shown) may be formed on the first lateral faces 606a, 608a so that when the chip stacks 602, 604 are bonded together, electrical interconnection can be established between chips in the adjacent chip stacks without extensive wiring. Advantageously, joining together multiple chip stacks to form a single electronic module provides a high-density, compact structure that can be conveniently installed and removed as a single unit.

As FIG. 6 further shows, the electronic module 600 can be mounted to a bonding substrate 610 for external circuitry connection. In one embodiment, a second lateral face 606b, 608b of both the first and second chip stacks 602, 604 of the module 600 are mounted to an upper surface 612 of the bonding substrate 610. Moreover, a metallized pattern may be formed on the upper surface 612 of the substrate 610 to establish interconnection with electrical contacts formed on the second lateral faces 606b, 608b of each chip stack 602, 604.

Figure 7:
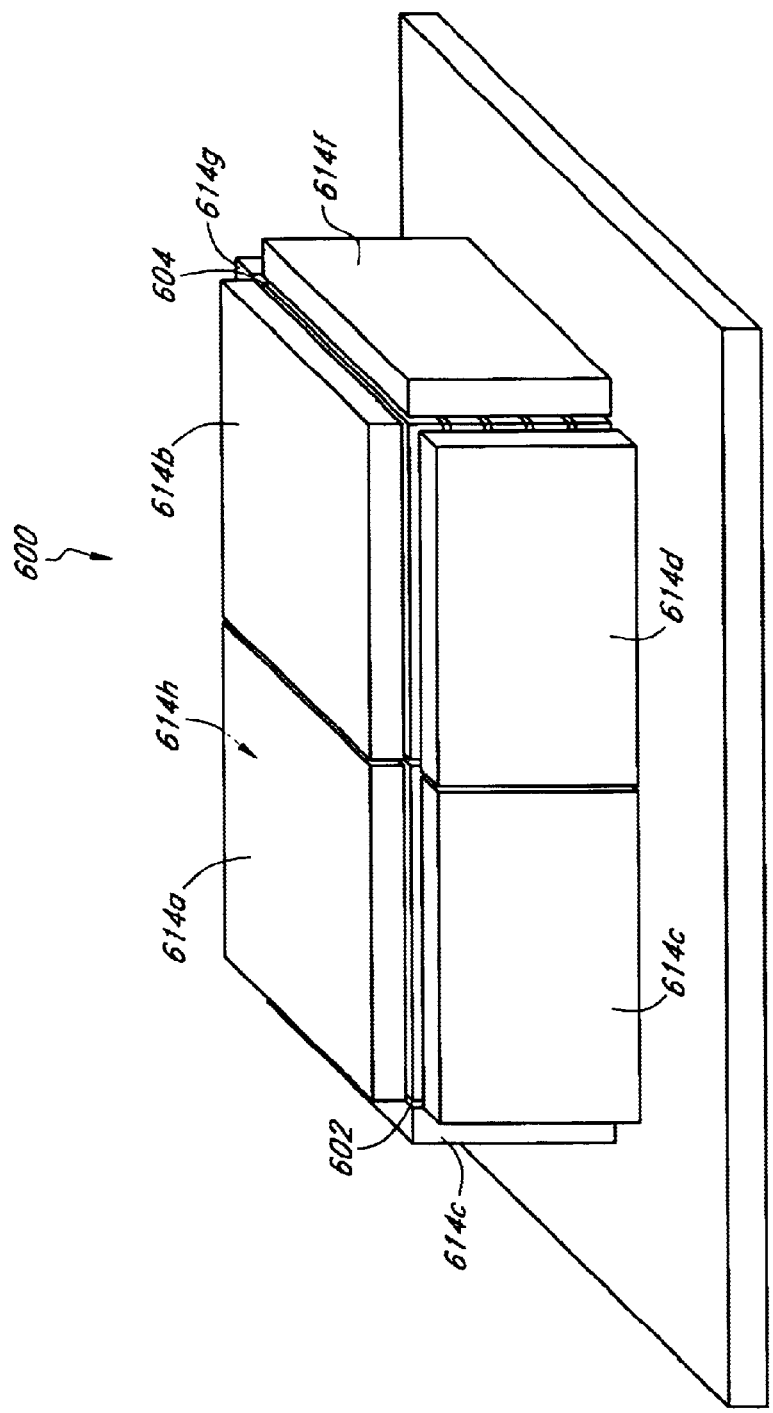
FIG. 7 is a schematic illustration of another embodiment of a high-density electronic packaging module incorporating the chip stack of FIG. 5.

FIG. 7 shows a plurality of exterior chips 614 a–h are mounted to the remaining exposed faces of the chip stacks 602, 604, which include the third and fourth lateral faces and the upper and the lower faces of the stacks. As shown in FIG.

7, an inner surface of each exterior chip 614 *a–h* extends across at least a portion of the respective face of the chip stacks 602, 604. In one embodiment, the chips within the chip stacks 602, 604 comprise memory chips while the exterior chips 614 *a–h* comprise non-memory chips such as processor chips, logic chips, and A/D converter chips that may not be included in most conventional multi-chip module due to overheating and chip interconnection problems. In another embodiment, the module 600 comprises chips sufficient to operate an entire system.

Furthermore, the exterior chips 614*a–h* can be mounted and interconnected to the chip stacks 602, 604 using C4 connections, modified C4 connections, and/or other methods disclosed in Applicant's co-pending U.S. patent applications Ser. No. 09/932,859, entitled "A THREE DIMENSIONAL MULTI-CHIP STRUCTURE AND METHOD OF MAKING THE SAME", and Ser. No. 09/944,957, entitled "ANGLED INTERCONNECT", which are hereby incorporated by reference. As described above, in one embodiment, the distance between rows of conductive interconnects on adjacent chips in the chip stacks are precisely fixed by the upper portions of the support frame on each chip so that the interconnects may be aligned with the C4 connections formed on the exterior chips.

Figure 8:
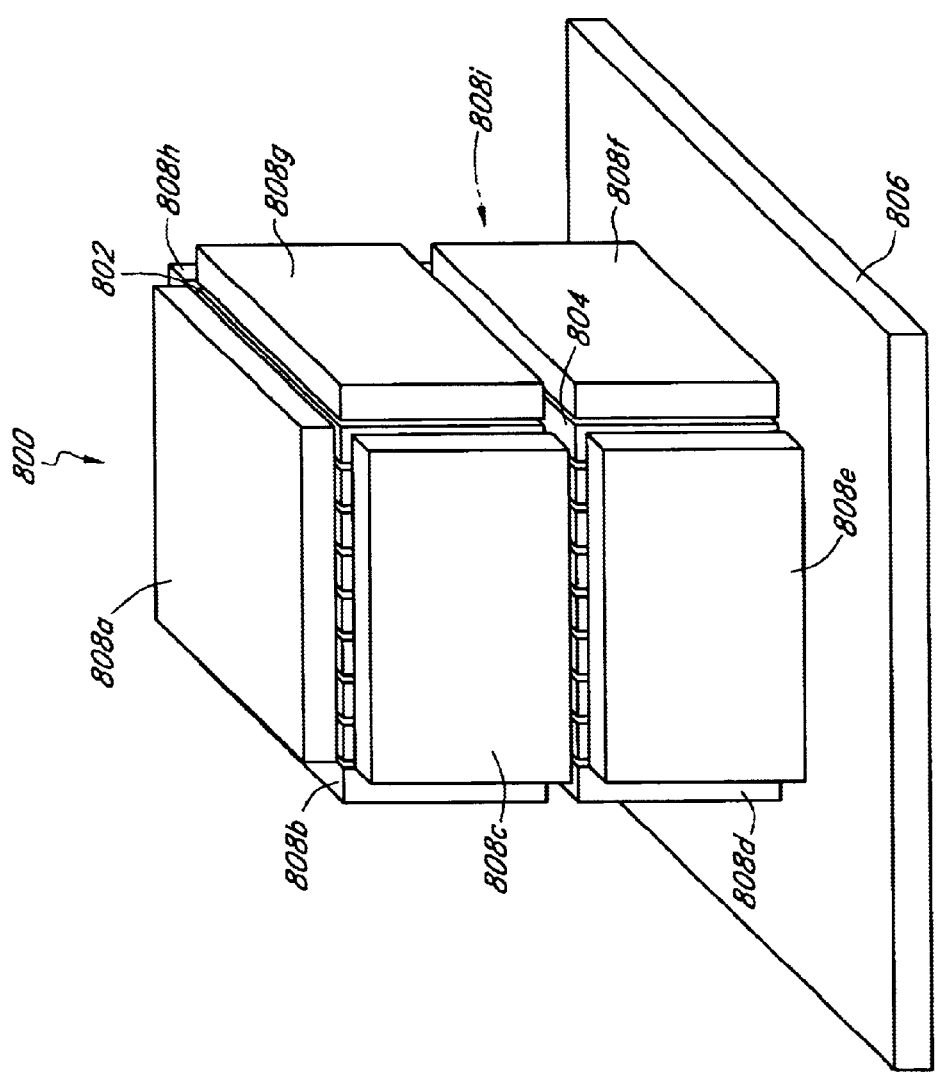
FIG. 8 is a schematic illustration of yet another embodiment of a high-density electronic packaging module incorporating the chip stack of FIG. 5.

FIG. 8 provides a schematic illustration of another embodiment of an electronic module 800 of the present invention. As shown in FIG. 8, the module 800 comprises two chip stacks 802, 804 that are bonded to each other in a substantially similar manner as the module 600 shown above in FIG. 7. In this embodiment, however, the chip stacks 802, 804 are placed in a vertical configuration and only one of the chip stacks 804 is attached to a bonding substrate 806. As also shown in FIG. 8, a plurality of exterior chips 808*a–i* are mounted to the exposed faces of the chip stacks 802, 804.

Figure 9:
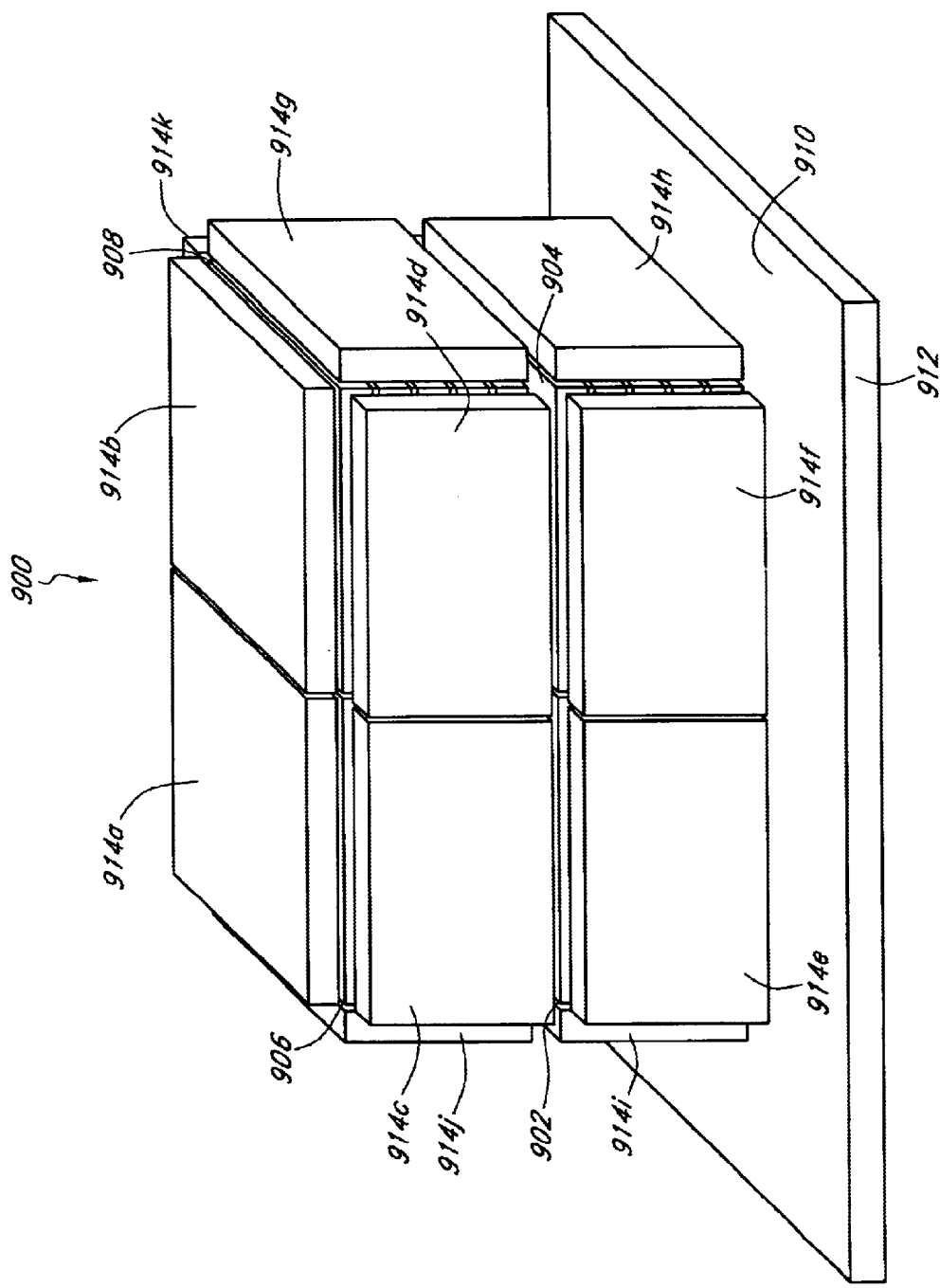
FIG. 9 is a schematic illustration of still yet another embodiment of a high-density electronic packaging module incorporating the chip stack of FIG. 5.

FIG. 9 shows yet another embodiment of an electronic module 900 of the present invention. In this embodiment, the module 900 comprises four chip stacks 902, 904, 906, 908 that are adhered together in a manner such that two chip stacks 902, 904 are bonded side-by-side while two additional chip stacks 906, 908 are positioned on an upper face of each respective stack 902, 904. As FIG. 9 also shows, the module 900 is in turn mounted to an upper surface 910 of a bonding substrate 912. Furthermore, a plurality of exterior chips 914*a–n* are also mounted to the remaining exposed faces on the chip stacks. Preferably, the exterior chips are connected to each other and to the chip stacks using edge connections and C4 connections. In one embodiment, active and passive devices in a first chip stack may be wired via edge connections to selected conductive interconnects on an adjacent chip stack.

Advantageously, the electronic module of the preferred embodiments provide increased flexibility for electrically interconnecting large assemblies of active and passive devices located within various chip stacks. In addition, increased flexibility is evident when interfacing a plurality of chip stacks with a computer hardware system. The potential increase in wiring density by bonding multiple chip stacks into a single electronic package is substantial. For instance, one module may comprise connecting three to seven non-memory chips to 64 memory chips. The number of memory chips interconnected may be doubled by using semiconductor chips having half of the conventional thickness. Accordingly, an electronic module containing four chip stacks, stacked two high by two wide on a substrate as shown in FIG. 9, may comprise 256 memory chip and 14 non-memory chips. Furthermore, it can be appreciated that the manner in which multiple chips stacks can be joined is not limited to the above described configurations. It can also be appreciated that the number of chip stacks that may be joined together into a single structure is also not limited to the examples shown and described above.

As such, the preferred embodiments show that multiple chip stacks may be assembled into a single module in a number of configurations: e.g., stacked side by side on the substrate, one chip stack positioned between the substrate and another chip stack. Furthermore, active and passive devices on chips located in a first chip stack may be wired via edge connections to selected conductive interconnects on chips located in an adjacent chip stack. Active and passive devices in the first and second chip stacks may be wired via edge connections to those in a third chip stack, which can be mounted directly on a bonding substrate using conductor lines, which may by-pass intermediately positioned devices. Wiring and interconnecting of the multiple chip stack assembly may be further increased by using front-to-back electrical vias that pass through the chip structures in the chip stacks located on the outer surfaces of the stack.

Figure 10:
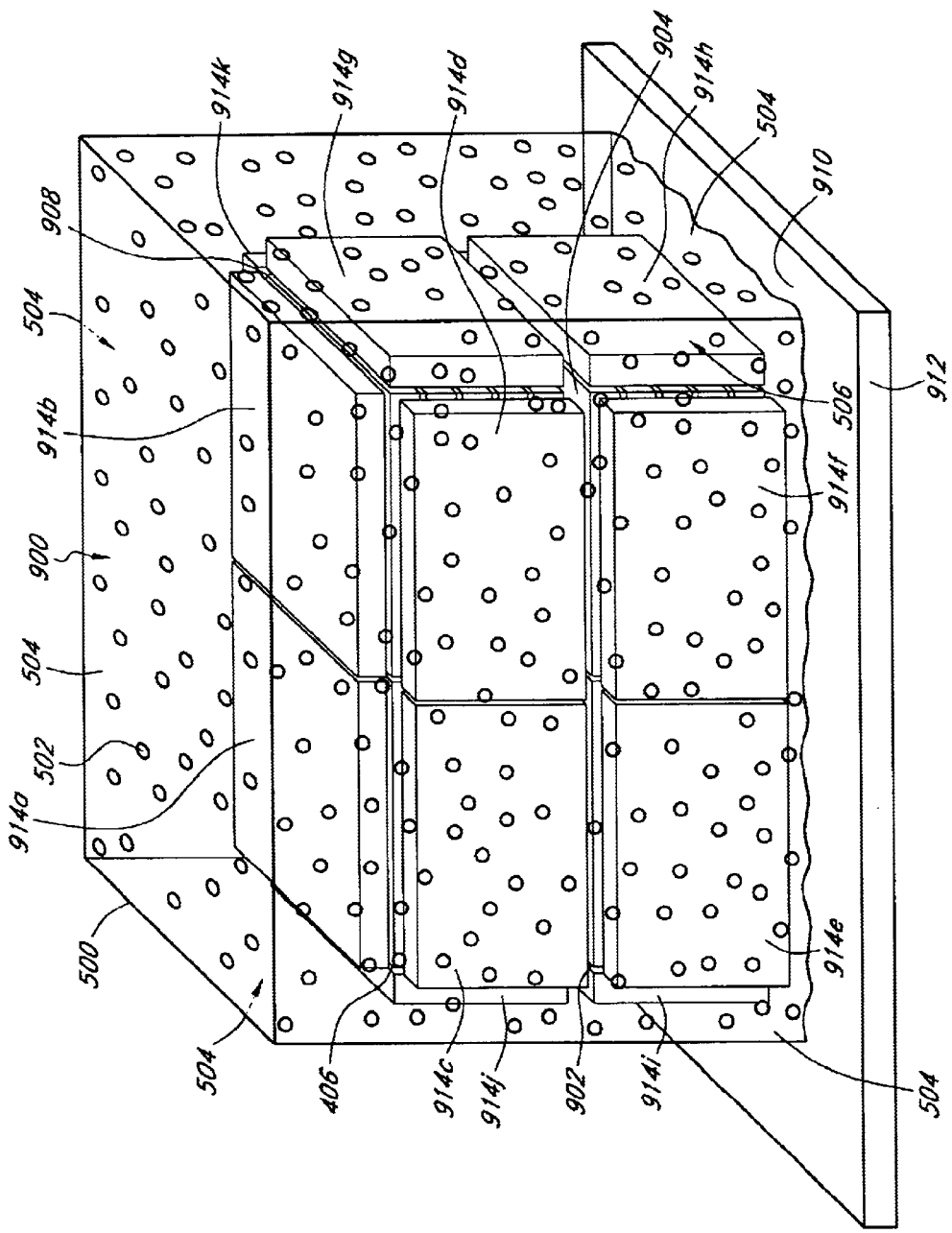
FIG. 10 is a schematic illustration of the high-density electronic packaging module of FIG. 9 enclosed in an enclosure.

FIG. 10 provides a schematic illustration of the electronic module 900 of FIG. 9 in which the module is enclosed in an enclosure 500 filled with a thermally conductive medium 502. As shown in FIG. 10, the enclosure 502 comprises a plurality of walls 506 defining an interior space 508 that is sufficiently large to contain the multi-chip structure 900 and still retain sufficient free space to permit the thermally conductive medium 502 to circulate around the multi-chip structure 900. Preferably, the thermally conductive medium 502 acts as a heat sink by contacting the air bridges and other circuitry and devices in the multi-chip structure and transferring heat generated therefrom to the thermally conductive medium. Although the chips are stacked together, the thermally conductive medium 502 is able to circulate to and from the air bridge structures and other conductors within the stack by traveling through the openings formed on the lateral surfaces of the support frames in each chip.

In one embodiment, the enclosure 500 is placed over the electronic module 900 and attached to the upper surface 910 of the bonding substrate 412. Preferably, the enclosure is hermetically sealed to the bonding substrate so as to isolate the module 900 from the external environment and to retain the thermally conductive medium 502 inside the enclosure. The enclosure 500 may be formed of an insulator material or a conductive material, such as glass or metal, in a manner known in the art. Preferably, the enclosure 500 is comprised of a copper alloy having a high thermal conductivity and sufficiently rigid to support a pressurized fluid. Moreover, the enclosure 500 is preferably comprised of a material that inhibits diffusivity of the thermally conductive medium 502.

In one embodiment, the thermally conductive medium 502 comprises a thermally conductive gas having a thermal conductivity greater than that of air. Preferably, the gas comprises pure hydrogen, helium, or a hydrogen-helium gaseous mixture. There are a number of advantages in selecting a hydrogen-helium gaseous mixture as the thermally conductive medium 502. First, the thermal conductivities of hydrogen and helium are similar to each other and much higher than those of most other gases. Second, the permeability or diffusivity of molecular hydrogen through metals, glasses, and other enclosures is significantly smaller than that of helium, and hence is less prone to diffuse out of an enclosure over time. However, the use of pure hydrogen gas may raise some safety concerns under certain operating conditions. Thus, a hydrogen/helium gas mixture provides a gas mixture that has high thermal conductivity, relatively low diffusivity, and yet does not raise any substantial safety concerns. In one embodiment, the gas mixture comprises about 10% hydrogen and 90% helium. Other embodiments may comprise various other ratios of hydrogen to helium.

Furthermore, the thermally conductive medium 502 may be pressurized so as to increase the density of the gas mixture that is enclosed by the enclosure 500. In one embodiment, the pressure of the thermally conductive fluid is maintained between a range of 5 MPa and 50 MPa. Advantageously, the thermal conductivities of hydrogen and helium are approximately proportional to their pressures and the thermal conductivity of a pressurized mixture of hydrogen and helium is remarkably high. For example, a hydrogen/helium gas mixtures at pressures of about 5 to 50 MPa yield thermal conductivities of about $1.6 \times 10^{-3}$ to $1.6 \times 10^{-2}$ cal-cm/sec, respectively. When compared with a thermal conductivity value of about $2.3 \times 10^{-2}$ for fused silicon and about $5.7 \times 10^{-5}$ for air at atmospheric pressure, a hydrogen/helium mixture at 50 MPa pressure is almost 300 hundred times that of air at atmospheric pressure. However, it can be appreciated that the optimum gas compositions and pressures will vary with the particular application being used. For example, in relatively larger volume packages, less helium-rich mixtures may suffice since loss of helium via out-diffusion through the enclosure may be insignificant. In small electronic packages, the use of pure hydrogen may be preferred since the thermal conductivity may be higher, out-diffusion may be negligible, and safety concerns may be relatively insignificant. It can also be appreciated that the thermally conductive medium 502 is not limited to any gaseous mixture and may comprise any type of thermally conductive fluid, including liquids.

Although the electronic module 900 of the preferred embodiment comprises air bridge structures that utilize air gap as an insulator, the module 900 is not limited to multi-chip structures that incorporate air insulators. In fact, the module 900 may incorporate chip stacks that utilize various approaches for insulating the metallurgical interconnection layers including low thermal conductivity spacer layers, such as low density polymeric foams, and\or insulator structures, such as silicon dioxide films and/or various hybrid insulating approaches. Implementation of the disclosed embodiments may be compatible with flip-chip bonding of the entire assembly to a ceramic substrate or other substrate. Furthermore, the enclosure 500 may be cooled using generally known cooling techniques, such as heat pipes, liquid coolants, external fins, and/or convective cooling fans.

Advantageously, the unique spacing configuration of the electronic module 900 permits efficient cooling by utilizing a pressurized, thermally conductive medium as a heat sink. The hermetically sealed enclosure permits efficient, pressurized cooling of the multi-chip structures, which may increase the reliability of the chip structures by reducing the occurrence of thermal breakdown associated with the self-overheating of integrated circuit components. Furthermore, increasing system reliability may reduce the incidence of system malfunctions.

As discussed above, densely packed integrated circuit chips such as those in a multi-chip structure tend to produce an increased amount of heat during normal operation. Therefore, an efficient system of cooling the chip by transferring a substantially amount of heat away from the chip improves the performance and reliability of the chip by reducing self-overheating. Advantageously, the electronic packaging module of the preferred embodiment provides a chip stack having open spaces created between adjacent chip substrates to allow a thermally conductive gas mixture to readily permeate the spaces and reach the air bridge conductors and other circuitry therein, which substantially reduces thermal hot spots within the multi-chip electronic package. Furthermore, integrated circuit chips of an entire system may be reliably packaged in a single, electronic module in a convenient, highly compact, and cost-efficient manner.

An advantage to utilizing multi-chip structures is that both memory chips and non-memory chips may be combined in a multi-chip electronic package. As such, stacked multi-chip structures that encapsulate an entire system may be packaged into a smaller, more compact stacked multi-chip structure to thereby significantly reduce the amount of required space needed to accommodate a plurality of individual integrated circuit elements internal to a system. A fully assembled multi-chip electronic structure and/or package may be conveniently plugged into a computer, machine, or other instrument as a micro-unit, which may increase efficiency, functionality, flexibility, and performance. Additionally, even though these multi-chip electronic structures and/or packages may generate high amounts of heat per unit area during normal operation, the unique spacing configuration permits efficient cooling by utilizing a pressurized, thermally conductive fluid as a heat sink. The hermetically sealed enclosure permits efficient, pressurized cooling of the multi-chip structures, which may increase the reliability of the chip structures by reducing the occurrence of thermal breakdown associated with the self-overheating of integrated circuit components. Furthermore, increasing system reliability may reduce the incidence of system malfunctions.

Furthermore, in fabricating the above-described multiple chip stack module, the individual chips and sub-assemblies of the module can be tested in accordance with the above-described preferred test sequence. Special Kerf sites can be formed to test the device properties before the addition of temporary materials that may alter the device properties and affect the accuracy of the test results. Special Kerf sites can also be formed to test the metallurgy of the circuits before the chips are assembled into the module. Moreover, the chips and sub-assemblies can be tested via a slow speed test that is unaffected by the temporary material and is designed to test the interconnection of the devices and chips while the temporary material is in place. The slow speed tests ensure that the assembly process is completed properly. After the module is assembled and all temporary material removed, the module is then subject to a high performance final test. Advantageously, the preferred test sequence is designed so that the failure rate at the final performance test is relatively low since defective device properties and metallurgy would have already been detected in previous test steps.

Although the foregoing description of the various embodiments of the invention have shown, described, and pointed out the fundamental novel features of the present invention, it will be understood that various omissions, substitutions, and changes in the form of the detail of the apparatus as illustrated as well as the uses thereof, may be made by those skilled in the art, without departing from the scope of the present invention.

Consequently, the scope of the present invention should not be limited to the foregoing discussions, but should be defined by the appended claims.

What is claimed is:

1. A method of manufacturing an integrated circuit chip, comprising:

forming a plurality of devices on a semiconductor substrate;

testing device properties to determine if the devices are functional;

forming a first plurality of conductors, wherein the conductors interconnect at least some of the devices;

forming a temporary member and a second plurality of conductors adjacent the substrate, wherein the temporary member supports at least some of the second conductors, wherein the temporary member alters at least some of the properties of at least some of the devices;

testing the devices at a speed substantially slower that the rated speed of the devices to determine whether the devices are electrically interconnected, wherein the result of the slow speed test is substantially unaffected by the changes in device property brought about by the temporary member;

completing formation of the integrated circuit chip;

removing the temporary member from the integrated circuit chip;

testing the functionality and connectivity of the chip by exercising the chip at its rated speed.

2. The method of claim 1, wherein forming a plurality of devices on the semiconductor substrate comprises forming devices selected from the group consisting of transistors, capacitors, resistors, memory cells, and logic gates.

3. The method of claim 1, wherein testing device properties comprises testing device properties selected from the group consisting of transistor parameters, metallurgical structures, capacitors, resistors, memory cells and logic gates.

4. The method of claim 1, wherein forming a plurality of second conductors comprises forming a plurality of air bridge conductors.

5. The method of claim 4, wherein forming the temporary member comprises forming a temporary support material that increases the capacitive load of the devices.

6. The method of claim 5, wherein the temporary member provides support and stability for the air bridge conductors.

7. The method of claim 5, wherein the temporary member is an insulative material.

8. The method of claim 5, wherein the temporary member comprises carbon.

9. The method of claim 5, wherein the temporary member comprises a polymer.

10. The method of claim 1, wherein testing the devices at a speed substantially slower than the rated speed comprises testing the devices at a speed of about 1% of the rated speed.

11. The method of claim 1, wherein forming a plurality of devices on a semiconductor substrate comprises forming the devices on a semiconductor wafer.

12. The method of claim 11, wherein testing the device properties comprises testing a plurality of test structures formed on the wafer.

13. The method of claim 12, wherein the test structures are formed on the Kerf area of the wafer.

14. The method of claim 1, further comprising testing the metallurgy to determine the dimensions and performance characteristics of the first and second conductors, wherein testing the metallurgy is performed after forming the second conductors and prior to removing the temporary member.

15. The method of claim 14, wherein testing the metallurgy comprises testing a plurality of test patterns formed on the Kerf area of the wafer, wherein the test patterns simulate the dimensions and configurations of at least some of the first and second conductors.

16. The method of claim 1, further comprising assembling the chip into a multi-chip stack after completing formation of the chip and prior to removing the temporary member from the chip.

17. The method of claim 16, wherein assembling the chip into a multi-chip stack comprises:

stacking and securing the chip with other chips to form a chip stack having four lateral faces, wherein each lateral face comprises a portion of each chip;

mounting three exterior chips respectively to three of the lateral faces of the chip stack, wherein a surface of each exterior chip extends across at least a portion of each respective lateral face.

18. The method of claim 17, wherein the exterior chips comprise logic chips and processor chips.

19. The method of claim 17, further comprising testing the chip stack at a speed slower than the rated speed of the chip stack prior to removal of the temporary member to determine whether the chips in the stack are properly interconnected to each other.

20. A method of forming a multi-chip electronic module, comprising:

forming a plurality of devices on a semiconductor substrate;

testing a plurality of device properties to determine whether the devices are properly formed;

forming a support frame on an upper surface of the semiconductor substrate, wherein the support frame extends from the upper surface of the substrate and defines a protected spatial region for interconnection wiring, wherein the support frame comprises a plurality of openings on a lateral surface of the frame so as to permit a thermally conductive fluid to travel to and from said spatial region;

forming a plurality interconnection wiring in said spatial region, wherein the interconnection wiring comprises air bridge conductors;

forming a temporary support material in the spatial region in a manner such that the temporary support material stabilizes and provides structure support for the air bridge conductors;

exercising the devices at a speed substantially slower than the rated speed of the devices to determine whether proper interconnections are made between devices;

assembling said semiconductor substrate in a chip stack, wherein an upper surface of the support frame is positioned adjacent to a lower surface of a second semiconductor substrate;

mounting said chip stack to a bonding substrate, wherein said chip stack is electrically connected to external circuitry formed on said bonding substrate so as to form a multi-chip electronic module;

exercising the multi-chip electronic module at a speed substantially slower than the rated speed of the module to determine whether proper electrical interconnections are established between chips in the module;

removing said temporary support material from the spatial region in a manner such that the air bridge conductors become suspended and surrounded by an air gap;

testing the functionality and interconnection of the multi-chip electronic module.

21. The method of claim 20 further comprising:

enclosing the multi-chip electronic module inside an enclosure;

introducing a thermally conductive fluid to said enclosure, said thermally conductive fluid has a thermal conductivity greater than that of air, wherein said thermally conductive fluid travels through the opening in the support frame and contacts the air bridge conductors formed in the spatial region.

22. The method of claim 20, wherein forming said temporary support material comprises forming a layer of organic material that can be chemically removed.

23. The method of claim 22, wherein forming said temporary support material comprises forming a layer of material comprising carbon.

24. The method of claim 22, where forming said temporary support material comprises forming a layer of material comprising parylene.

25. The method of claim 24, wherein the parylene is parylene C.

26. The method of claim 22, wherein forming said temporary support material comprises forming a layer of polymer.

27. The method of claim 26, wherein said polymer is a high temperature polyimide.

28. The method of claim 26, wherein said polymer is a photoresist.

29. The method of claim 20, wherein removing said support material comprises oxidizing the material in a plasma environment.

30. The method of claim 21, wherein introducing said thermally conductive fluid into said enclosure comprises introducing a gas mixture.

31. The method of claim 30, wherein said gas mixture comprises helium and hydrogen.

32. The method of claim 31, wherein said gas mixture comprises about 10 percent hydrogen and about 90 percent helium.

33. The method of claim 30, wherein said gas mixture is at a pressure of between about 5 to 50 MPa.

34. The method of claim 31, wherein hydrogen in said gas mixture is at a pressure greater than helium.

35. The method of claim 30, wherein said gas mixture is at a pressure higher than pressure external to the enclosure.

36. The method of claim 20 wherein mounting said chip stack onto the bonding substrate comprises using a C4 structure.

37. The method of claim 20, wherein further comprising mounting at least one exterior chip to at least one of the three lateral faces of the chip stack, wherein a surface of the exterior chip extends across at least a portion of the lateral face; wherein the at least one exterior chip is mounted after assembling the chip stack and before bonding the chip stack to a substrate.

38. The method of claim 37, wherein the at least one exterior chip comprises a logic chip.

39. The method of claim 20, further comprising testing the metallurgy after forming the temporary support material and before exercising the devices at a slow speed.

40. The method of claim 39, wherein testing the metallurgy comprises testing to determine the presence of opens and shorts in the interconnection wiring.

41. The method of claim 39, wherein testing the metallurgy comprises testing to determine the dimensions of the interconnection wiring.

* * * * *

UNITED STATES PATENT AND TRADEMARK OFFICE
CERTIFICATE OF CORRECTION

PATENT NO. : 6,620,638 B1
DATED : September 16, 2003
INVENTOR(S) : Farrar

It is certified that error appears in the above-identified patent and that said Letters Patent is hereby corrected as shown below:

Column 17,
Line 11, please delete "that" and insert therefore, -- than --.

Signed and Sealed this

Seventh Day of September, 2004

JON W. DUDAS
*Director of the United States Patent and Trademark Office*